(12) United States Patent
Hodges et al.

(10) Patent No.: US 10,193,295 B2
(45) Date of Patent: Jan. 29, 2019

(54) FIBER LASER FIBER PACKAGING AND THERMAL MANAGEMENT

(71) Applicant: nLIGHT, Inc., Vancouver, WA (US)

(72) Inventors: Aaron Ludwig Hodges, La Center, WA (US); C. Geoffrey Fanning, Portland, OR (US); Christopher Luetjen, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/718,889

(22) Filed: Sep. 28, 2017

(65) Prior Publication Data

US 2018/0097333 A1    Apr. 5, 2018

Related U.S. Application Data

(60) Provisional application No. 62/402,716, filed on Sep. 30, 2016.

(51) Int. Cl.
*G02B 6/46*      (2006.01)
*H01S 3/067*     (2006.01)
(Continued)

(52) U.S. Cl.
CPC ........ *H01S 3/06704* (2013.01); *G02B 6/2553* (2013.01); *G02B 6/445* (2013.01); *H01S 3/0014* (2013.01); *H01S 3/0405* (2013.01); *H01S 3/0941* (2013.01); *H01S 3/094003* (2013.01); *B65H 57/003* (2013.01); *H01S 3/042* (2013.01); *H01S 3/0407* (2013.01); *H01S 3/09415* (2013.01); *H01S 3/094053* (2013.01);
(Continued)

(58) Field of Classification Search
CPC ...... G02B 6/2553; G02B 6/445; H01S 3/0405
See application file for complete search history.

(56) References Cited

U.S. PATENT DOCUMENTS 6,535,682 B1    3/2003  Puetz et al.
8,346,043 B2    1/2013  Baum et al.
(Continued)

FOREIGN PATENT DOCUMENTS

JP    2006 120958       5/2006
WO    WO 03/089973    10/2003

OTHER PUBLICATIONS

International Search Report and Written Opinion for related International Application No. PCT/US2017/054076, dated Feb. 15, 2018, 16 pages.

*Primary Examiner* — Tuan Nguyen
(74) *Attorney, Agent, or Firm* — Klarquist Sparkman, LLP

(57) ABSTRACT

A fiber laser system comprises a main body, wherein the main body includes one or more fiber laser system components and a first wall hingedly attached to the main body along a first edge, the first wall having a first wall open position and a first wall closed position and a plurality of feed fiber management and splicing components mounted to the first wall. Additionally and/or alternatively, the laser system may comprise a cooling plate hingedly attached to the main body, the cooling plate has a cooling plate open position and a cooling plate closed position. Additionally and/or alternatively, the laser system may include a fiber management tray hingedly mounted to the cooling plate, the fiber management tray having a fiber management tray open position and a fiber management tray closed position.

38 Claims, 18 Drawing Sheets

(51) Int. Cl.
  *G02B 6/255*   (2006.01)
  *H01S 3/00*    (2006.01)
  *H01S 3/04*    (2006.01)
  *H01S 3/094*   (2006.01)
  *H01S 3/0941*  (2006.01)
  *G02B 6/44*    (2006.01)
  *B65H 57/00*   (2006.01)
  *H01S 5/02*    (2006.01)
  *H01S 5/022*   (2006.01)
  *H01S 5/024*   (2006.01)
  *H01S 5/40*    (2006.01)
  *H01S 3/042*   (2006.01)

(52) U.S. Cl.
  CPC ............. *H01S 5/02* (2013.01); *H01S 5/02248* (2013.01); *H01S 5/02423* (2013.01); *H01S 5/4025* (2013.01)

(56) References Cited

U.S. PATENT DOCUMENTS

| | | | |
|---|---|---|---|
| 2011/0013875 A1* | 1/2011 | Bran De Leon | G02B 6/445 385/135 |
| 2013/0243386 A1* | 9/2013 | Pimentel | G02B 6/4441 385/135 |
| 2015/0023645 A1 | 1/2015 | Boelen et al. | |
| 2015/0110136 A1 | 4/2015 | Schusslbauer et al. | |
| 2016/0091661 A1* | 3/2016 | Lloyd | G02B 6/2553 156/158 |

\* cited by examiner

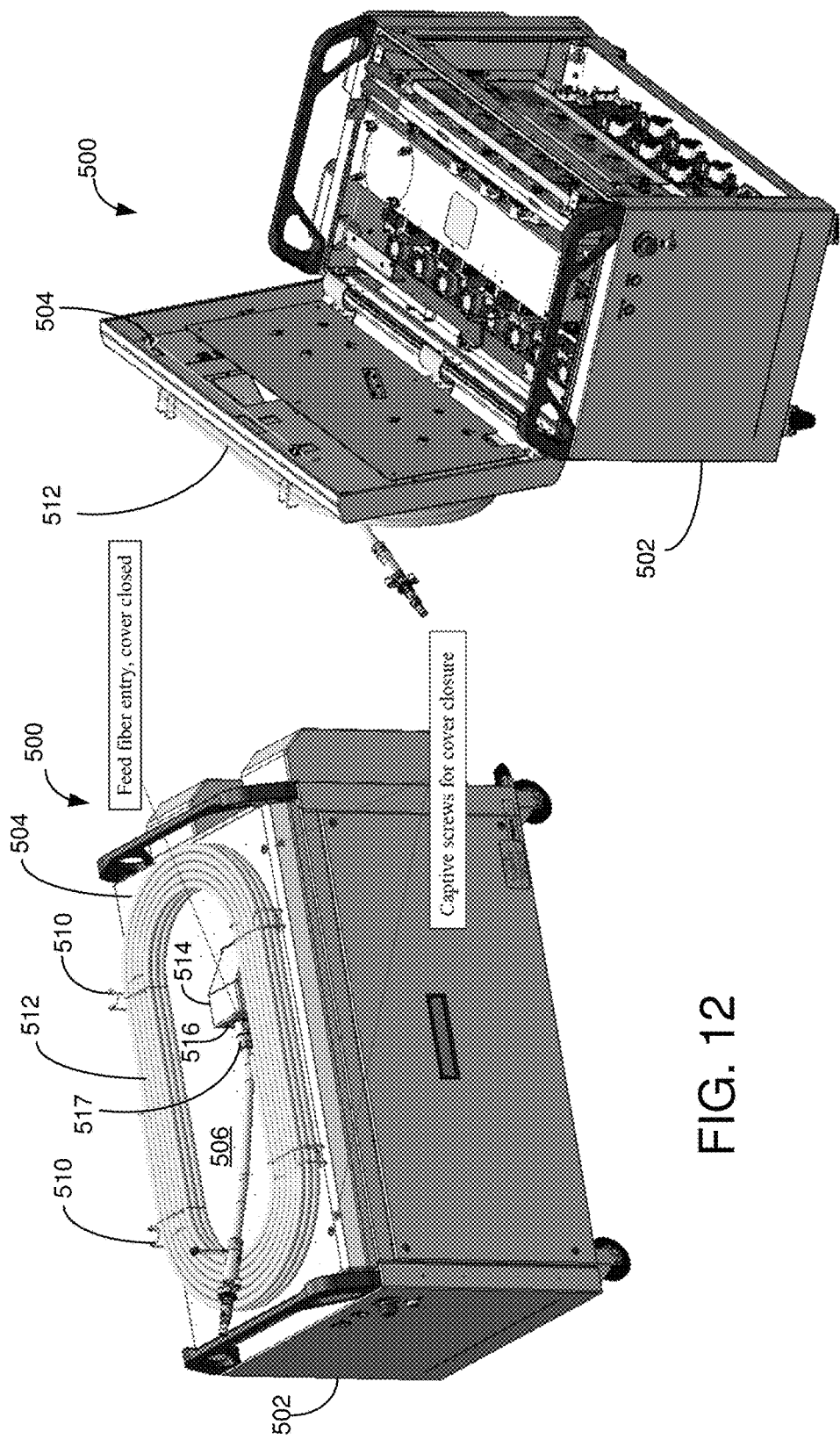

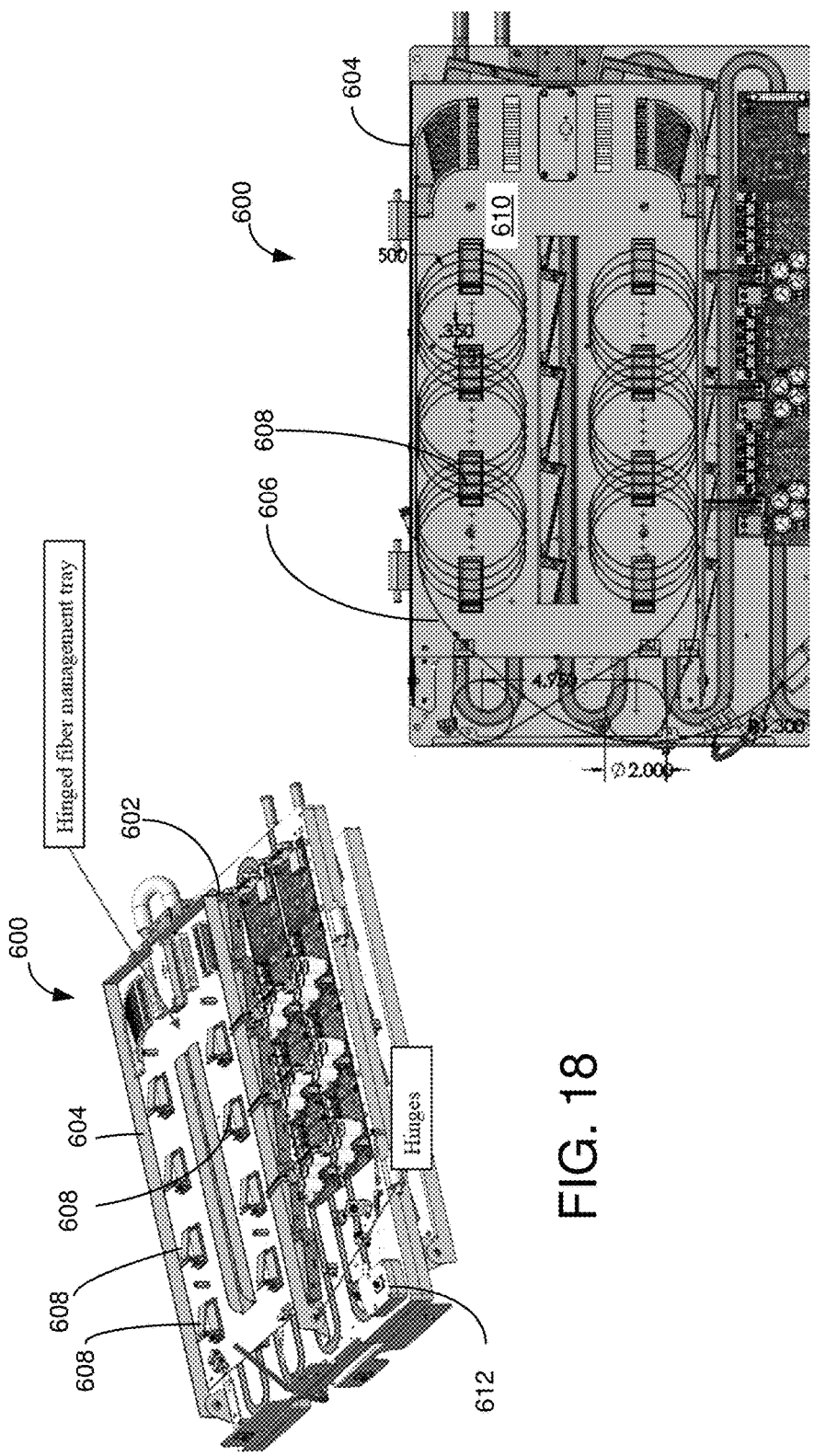

FIBER LASER FIBER PACKAGING AND THERMAL MANAGEMENT

CROSS REFERENCE TO RELATED APPLICATION

This application claims the benefit of U.S. Provisional Patent Application No. 62/402,716, filed Sep. 30, 2017, which is incorporated by reference herein in its entirety.

FIELD

Generally, the field of the present disclosure is high power fiber lasers. More particularly, the present disclosure relates to modular and/or scalable high power continuous-wave and quasi-continuous-wave fiber lasers.

BACKGROUND

Conventional fiber laser component systems generally have limited field serviceability, often requiring replacement of the entire fiber laser component system if an optical component thereof fails. Such entire replacement occurs even when the optical component failure is localized to only a portion of the fiber component system, such as a broken fiber. Requiring the replacement of entire fiber laser component systems increases cost for repair of the complete multi-kilowatt system. Field replacement of a fiber laser component system typically requires highly specialized equipment and clean-room conditions, which are not readily available in factory environments, making service costly and disruptive.

For example, replacing the feed fiber, the optical fiber through which laser light is transmitted from the fiber laser to the process head, is a common field service activity for high power continuous-wave (CW) fiber lasers. Gaining access to the location of a feed fiber splice and associated fiber management mandrels can be challenging for field service and can include turning the unit upside down, removing an access panel, then working down inside the unit to remove the old feed fiber and put in a new one.

Further, a portion of the feed fiber is often attached to one panel or part and a terminal or pigtail portion of the feed fiber is typically routed to another panel or part for management and splicing. This routing often involves additional feed fiber length and/or additional brackets and guard to protect the fiber along its path from where it enters the unit to where it is managed and spliced. Moreover, it can mean removal of other portions of the system to access the feed fiber routing or, conversely, removing the feed fiber to access other portions of the system.

Conventional system designs are also limited with respect to how technological advances can be accommodated or incorporated since many key components are integrated into each fiber laser. For example, pump diode technology is advancing rapidly, providing increased power, brightness, and efficiency and reduced cost. Active fibers have also experienced significant technological gains in recent years. Incorporating these advances into an existing fiber laser can be difficult or impossible if the pump diodes, fibers, and electronics are all integrated into a single laser module. For example, the interconnections among components within a single laser module would likely be inaccessible or not easily changeable, and changes to critical components would entail significant changes in other components. Similarly, the mechanical or thermal designs could be impacted by changing a critical component. Thus, conventional high power fiber laser architectures often must either forgo upgrades based on technological advances or commit to costly and time consuming redesign.

Furthermore, size and weight are critical attributes of industrial lasers. To achieve small size and weight, dense packaging of laser system components is desirable, but dense packaging can also make systems difficult to assemble and service. This often leads to stacking of components which can made rework or field serviceability difficult and prone to causing collateral damage.

A need therefore exists for a fiber laser architecture that minimizes cost by eliminating component redundancy, is easily and cost-effectively serviceable in the field, enables field upgradability, and is sufficiently flexible to accommodate technological advances without significant cost or design change.

SUMMARY

According to one aspect of the present disclosure, a fiber laser system can include a main body, wherein the main body includes one or more fiber laser system components, a first wall hingedly attached to the main body along a first edge, the first wall having an open position and a closed position and a plurality of feed fiber management and splicing components mounted to the first wall. In some embodiments, the plurality of feed fiber management and splicing components can include a feed fiber splice block removably mounted to an interior surface of the first wall. Additionally and/or alternatively, the first wall can define an aperture configured to guide a feed fiber from a top surface of the first wall to an interior surface of the first wall. Additionally and/or alternatively, a feed fiber entry housing can be mounted to the first wall and having a face that is situated at a non-zero angle, such as perpendicular, to a top surface of the first wall, wherein an entry housing face defines an aperture configured to guide a feed fiber from the top surface of the first wall to an interior surface of the first wall.

In some embodiments, the plurality of feed fiber management and splicing components can include a first set of feed fiber guide members and a second set of feed fiber guide members mounted to the interior of the first wall on opposing sides of the feed fiber splice block. Additionally and/or alternatively, the first and second sets of feed fiber guide members can each be mounted in to provide a curved or circular layout on opposing sides of the feed fiber splice block for mounted feed fiber so that the mounted feed fiber can be secured with minimal bending or with a selected bending profile. Additionally and/or alternatively, the one or more fiber laser system components include one or more system component fibers and the feed fiber splice block is not in direct contact with the one or more system component fibers. Additionally and/or alternatively, some embodiments may include a restraining arm configured to restrain the first wall from hingedly moving beyond a predetermined angle.

According to another aspect of the present disclosure, a fiber laser system can include a main body, wherein the main body includes one or more fiber laser system components, a panel removably attached to the main body, and a cooling plate disposed adjacent to the panel, the cooling plate hingedly attached to the main body, wherein when the panel is removed from the main body, the cooling plate has an open position and a closed position. In some embodiments, the cooling plate has a first side and a second side and the cooling plate is configured to provide cooling and support to one or more fiber laser system components on both the first and second sides. Additionally and/or alternatively, in the open position the second side is accessible and in the closed position the second side is inaccessible. Some embodiments may include a restraining arm configured to restrain the cooling plate from hingedly moving beyond a predetermined angle. Some embodiments may include one or more releasable retaining members configured to releasably retain the cooling plate in the closed position.

Some embodiments may include one or more fiber laser system components mounted to the first or the second side of the cooling plate. The one or more fiber laser system components can comprise a plurality of pump diodes mounted to the cooling plate and a fiber management tray mounted to the cooling plate such that the pump diodes are disposed between the fiber management tray and the cooling plate. In some embodiments, the fiber management tray is hingedly mounted to the cooling plate and includes an open position and a closed position, wherein in the open position the plurality of pump diodes are accessible and in the closed position the plurality of pump diodes are inaccessible. Additionally and/or alternatively, the fiber management tray includes a body and two arms extending from the body, the two arms hingedly attached to the cooling plate, such that in the open position the body is spaced from the cooling plate. Additionally and/or alternatively, the fiber management tray includes a heat sink. Additionally and/or alternatively, a top surface of the fiber management tray includes a plurality of guide elements configured to guide or retain pump diode fibers. Additionally and/or alternatively, the fiber management tray includes a centrally disposed slot having walls that extend at a non-zero angle, such as perpendicular, to the top surface. Additionally and/or alternatively, the fiber management tray perimeter includes walls that extend perpendicular to the top surface.

According to another aspect of the present disclosure, a fiber laser system can include a main body, wherein the main body includes one or more fiber laser system components, a panel removably attached to the main body, a cooling plate disposed adjacent to the panel, and a fiber management tray hingedly mounted to the cooling plate, the fiber management tray having an open position and a closed position. In some embodiments a plurality of pump diodes can be mounted to the cooling plate, wherein in the open position the plurality of pump diodes are accessible and in the closed position the plurality of pump diodes are inaccessible. Additionally and/or alternatively, the fiber management tray includes a body and two arms extending from the body, the two arms hingedly attached to the cooling plate, such that in the open position the body is spaced from the cooling plate. Additionally and/or alternatively, the fiber management tray includes a heat sink. Additionally and/or alternatively, a top surface of the fiber management tray includes a plurality of guide elements configured to guide or retain pump diode fibers. Additionally and/or alternatively, the fiber management tray includes a centrally disposed slot having walls that extend at a non-zero angle, such as perpendicularly, to the top surface. Additionally and/or alternatively, the fiber management tray perimeter includes walls that extend perpendicularly to the top surface.

In some embodiments, the cooling plate has a first side and a second side and the cooling plate is configured to provide cooling and support to one or more fiber laser system components on both the first and second sides. Additionally and/or alternatively, the cooling plate is hingedly attached to the main body, wherein when the panel is removed from the main body, the cooling plate has an open position and a closed position. Additionally and/or alternatively, in the open position the second side is accessible and in the closed position the second side is inaccessible. Additionally and/or alternatively, a restraining arm can be configured to restrain the cooling plate from hingedly moving beyond a predetermined angle. Additionally and/or alternatively, one or more releasable retaining members can be configured to releasably retain the cooling plate in the closed position. Additionally and/or alternatively, one or more fiber laser system components can be mounted to the first and the second side of the cooling plate.

According to another aspect of the present disclosure, a fiber laser system can include a main body, wherein the main body includes one or more fiber laser system components, a first wall hingedly attached to the main body along a first edge, the first wall having a first wall open position and a first wall closed position, a plurality of feed fiber management and splicing components mounted to the first wall, a cooling plate hingedly attached to the main body, the cooling plate has a cooling plate open position and a cooling plate closed position, and a fiber management tray hingedly mounted to the cooling plate, the fiber management tray having a fiber management tray open position and a fiber management tray closed position.

The foregoing and other features, and advantages of the disclosed technology will become more apparent from the following detailed description, which proceeds with reference to the accompanying figures.

BRIEF DESCRIPTION OF THE DRAWINGS

FIG. 12 is a side perspective view of a fiber laser system in accordance with an aspect of the present disclosure.

FIG. 13 is a side perspective view of the system of FIG. 12, showing the first outside wall in an open position and the second outside wall removed.

FIG. 18 is a perspective view of a fiber management tray in a closed position in accordance with an aspect of the present disclosure.

FIG. 19 is a top view of the fiber management tray of FIG. 18.

DETAILED DESCRIPTION

Figure 1:
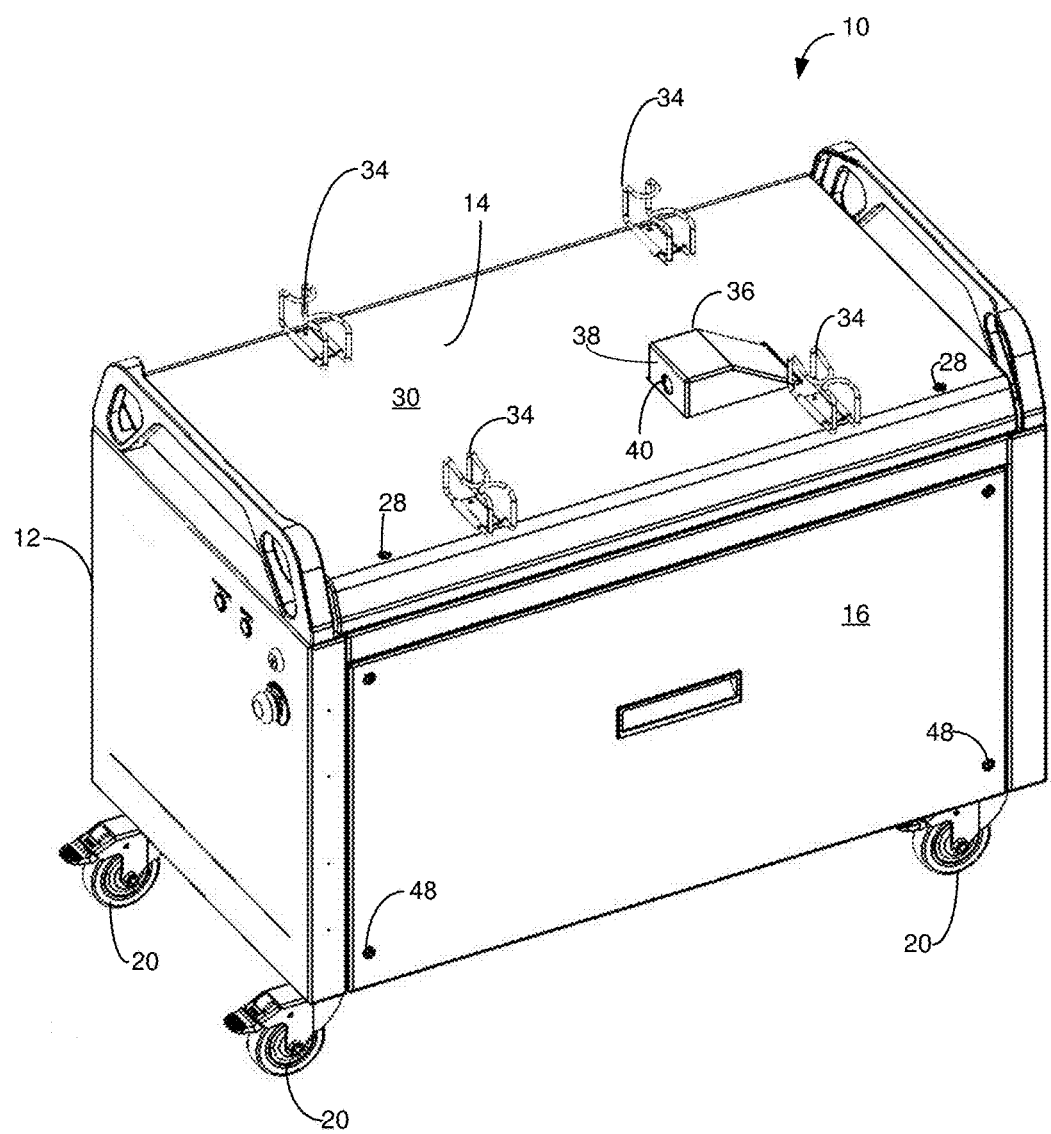
FIG. 1 is a side perspective view of a fiber laser system in accordance with an aspect of the present disclosure.

A perspective view of a first embodiment of a highly configurable, modular, and scalable continuous-wave or quasi-continuous-wave high-power fiber laser system 10 is shown in FIG. 1. The system 10 may include a main body 12 having one or more outside walls that may be moveable and/or removable with respect to the main body 12. For example, the main body 12 can include a cover 14, also referred to as a first outside wall, and a panel 16, also referred to as a second outside wall. The system 10 can be modular and/or compact. For example, the system 10 may be limited in size in order to fit into a 19 inch rack.

Figure 2:
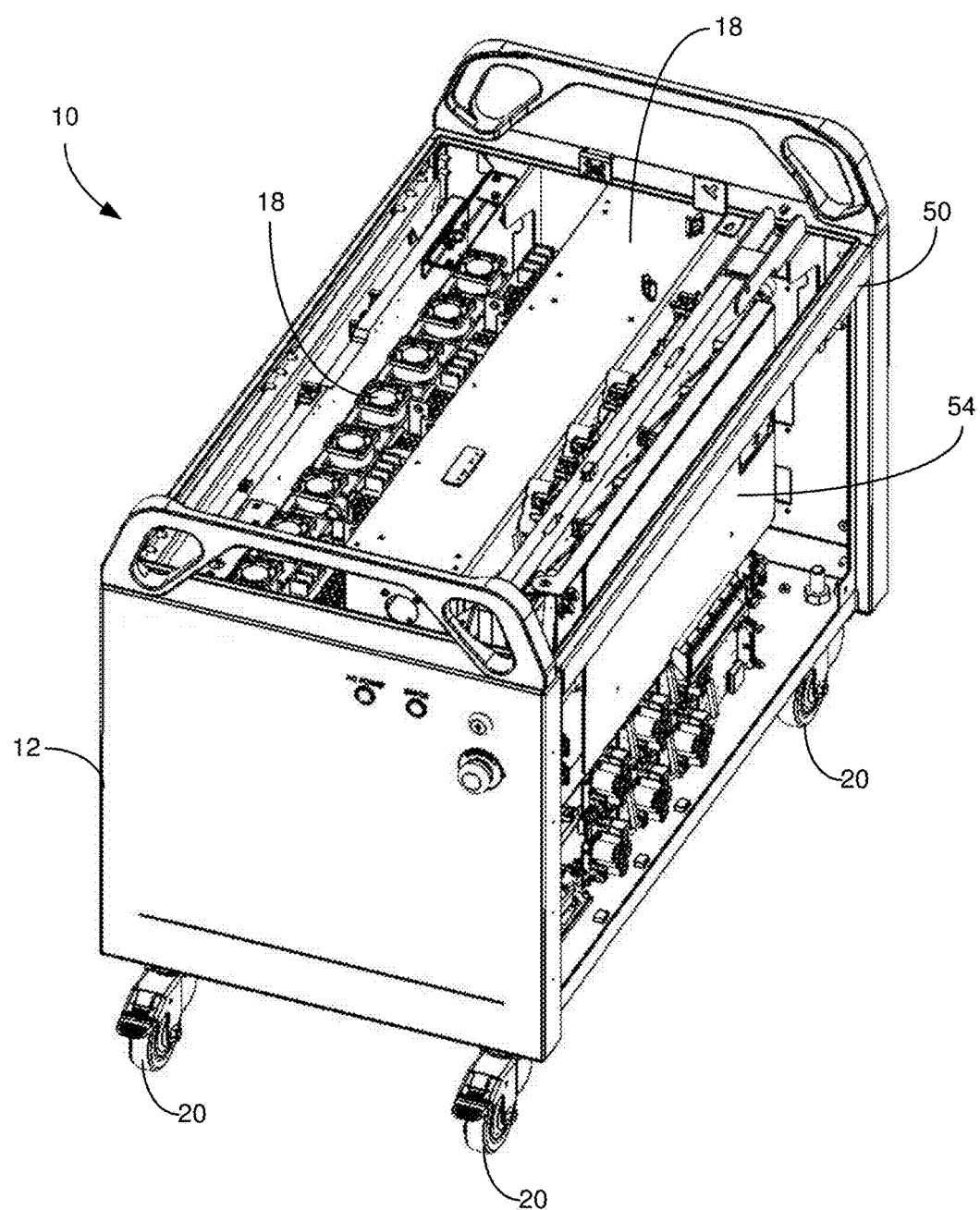
FIG. 2 is a perspective view of the system of FIG. 1, showing a first outside wall and a second outside wall removed.

FIG. 2 shows the fiber laser system 10 with the cover 14 and the side panel 16 removed from the main body 12. The fiber laser system 10 can include one or more system modules 18, also referred to as system components, including system pump modules and system gain modules, each of which can be configured to be modular and/or separable from the fiber laser system 10. Additional modules, such as a control module or a power supply module, also can be modularly disposed in relation to the other system modules 18 of the system 10 such that different modules can be conveniently removed and replaced after failure or to provide upgraded performance without requiring removal and replacement of other modules or a different main body 12. The system modules 18 can be mounted in a rack vertically, horizontally, or in another orientation, or combination thereof. Modules 18 can be physically separated from each other to facilitate integration into a desired space. The scalable multi-kilowatt fiber laser system 10 is depicted in an optional mobile configuration, mounted atop a plurality of casters 20 for convenient movement in an industrial environment.

Figure 3:
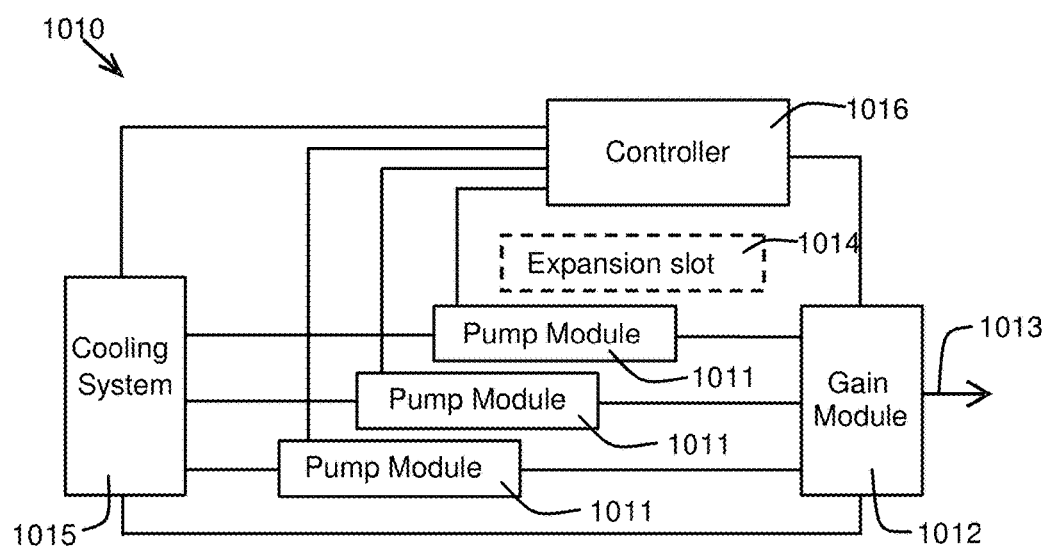
FIG. 3 is an exemplary connectivity diagram of the fiber laser system depicted in FIG. 1.
Figure 4:
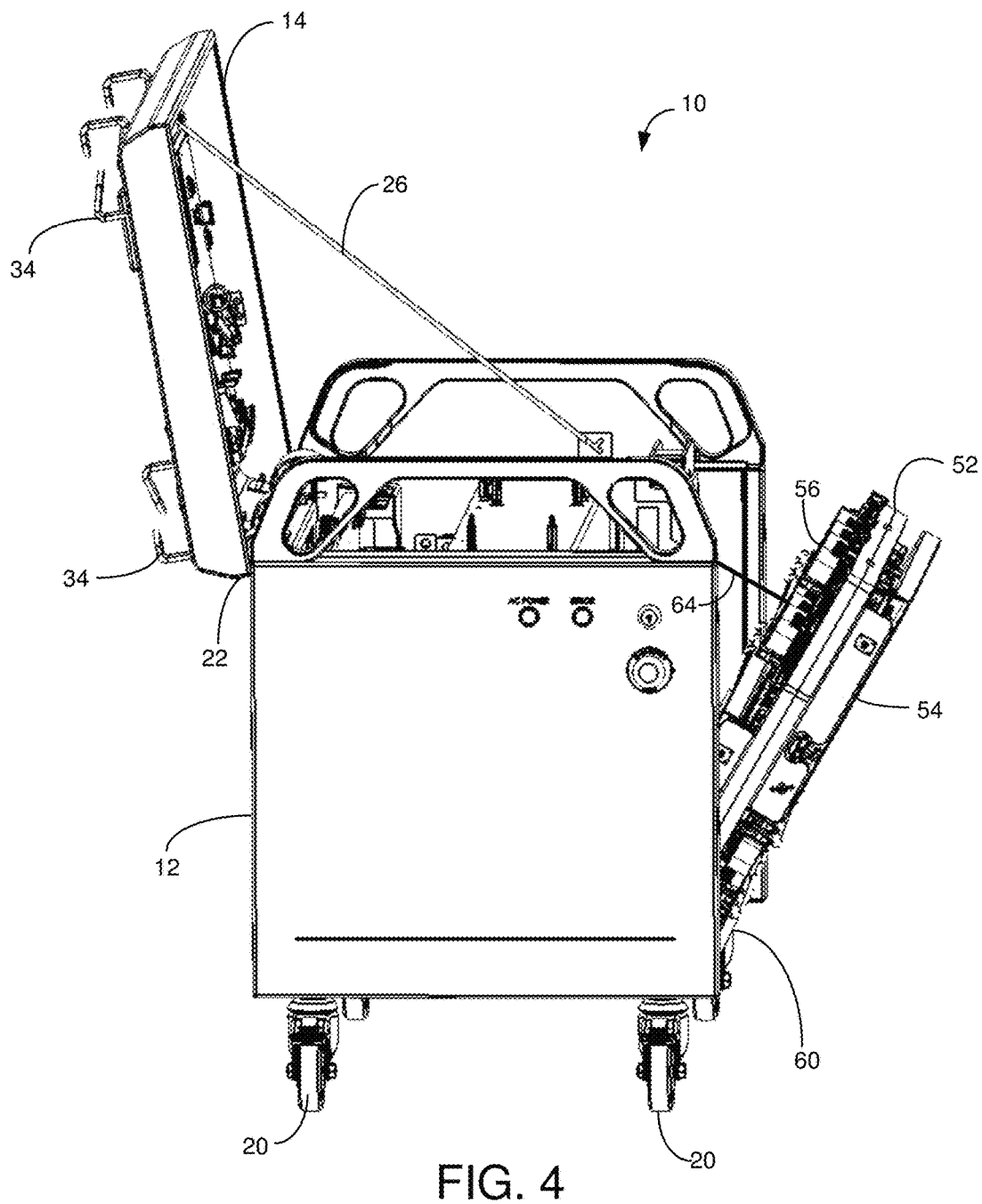
FIG. 4 is a side perspective view of the system of FIG. 1, showing the first outside wall in an open position and the second outside wall removed.
Figure 5:
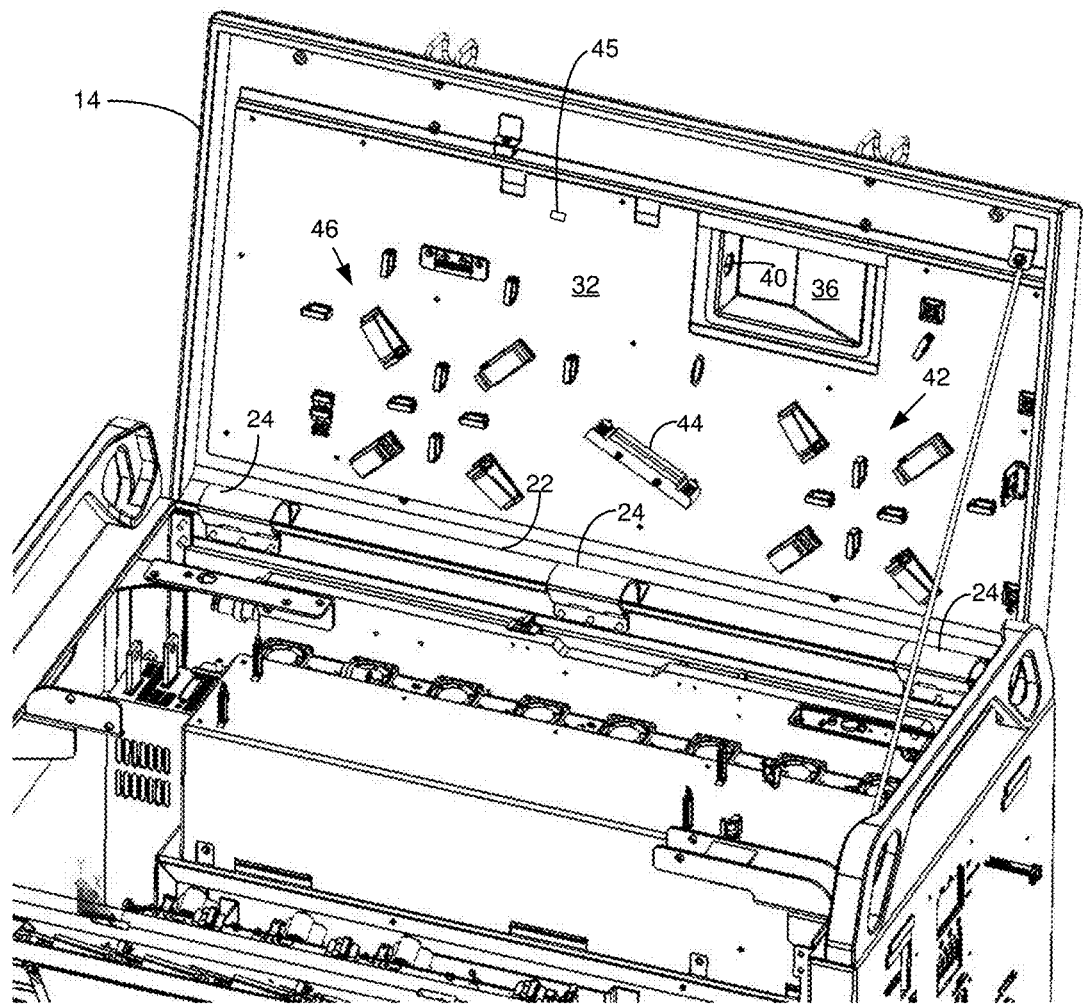
FIG. 5 is a top perspective partial view of the system of FIG. 1, showing the first outside wall in the open position.
Figure 6:
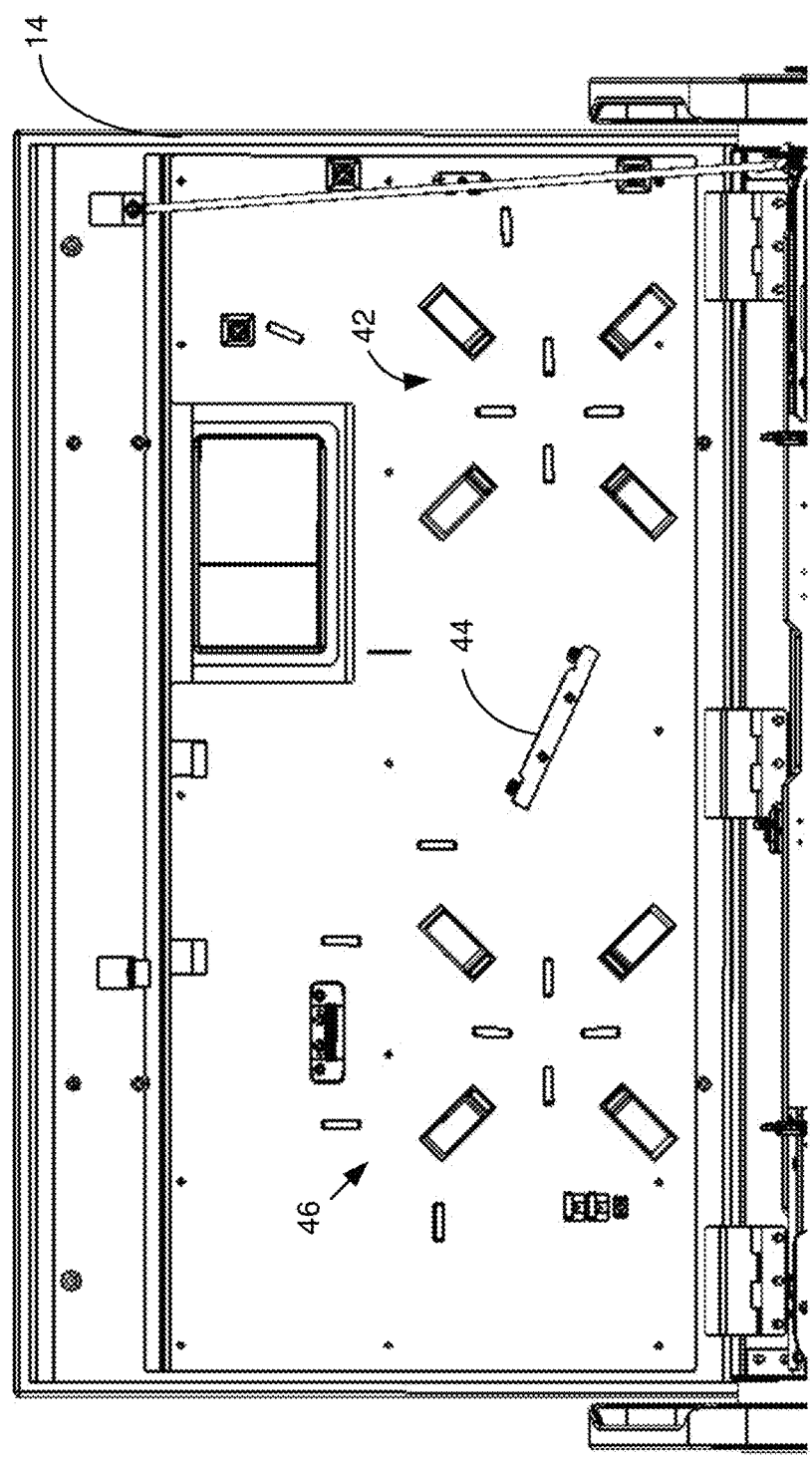
FIG. 6 is a side partial view of the system of FIG. 1, showing the first outside wall in the open position.
Figure 7:
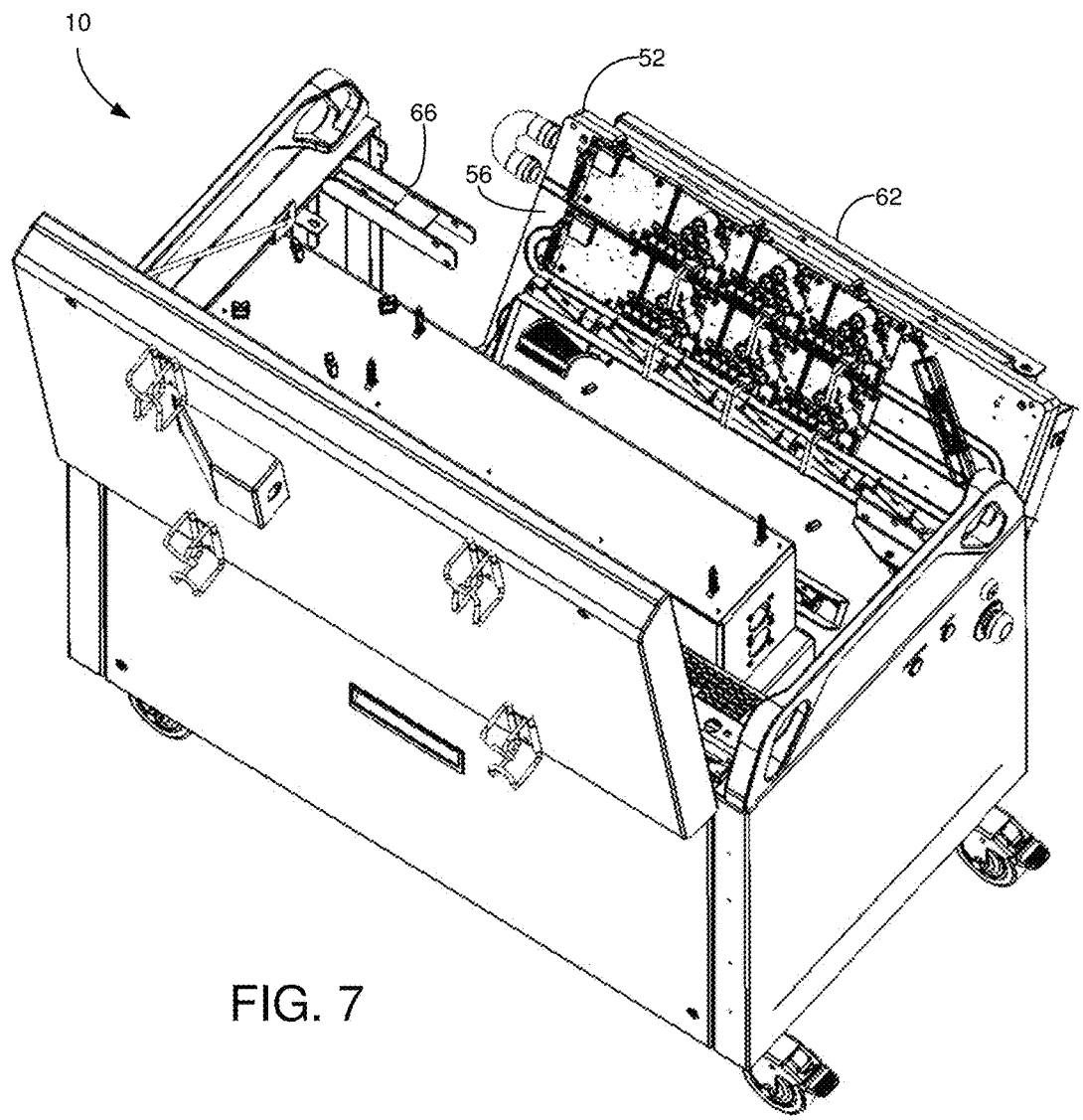
FIG. 7 is a top perspective view of the system of FIG. 1, showing the first outside wall in the open position and the second outside wall removed.
Figure 8:
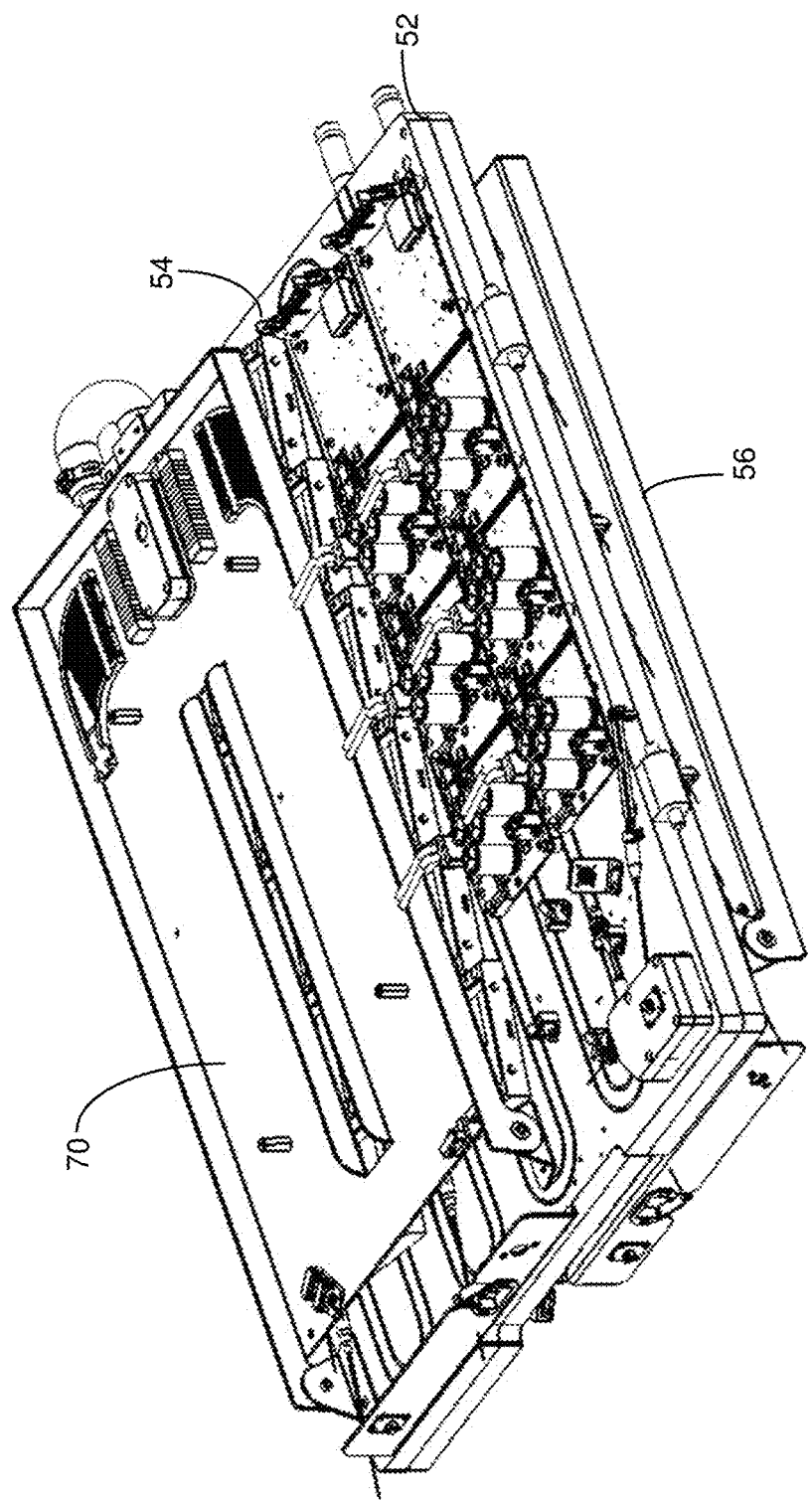
FIG. 8 is a perspective view of a fiber management tray in a closed position in accordance with an aspect of the present disclosure.
Figure 9:
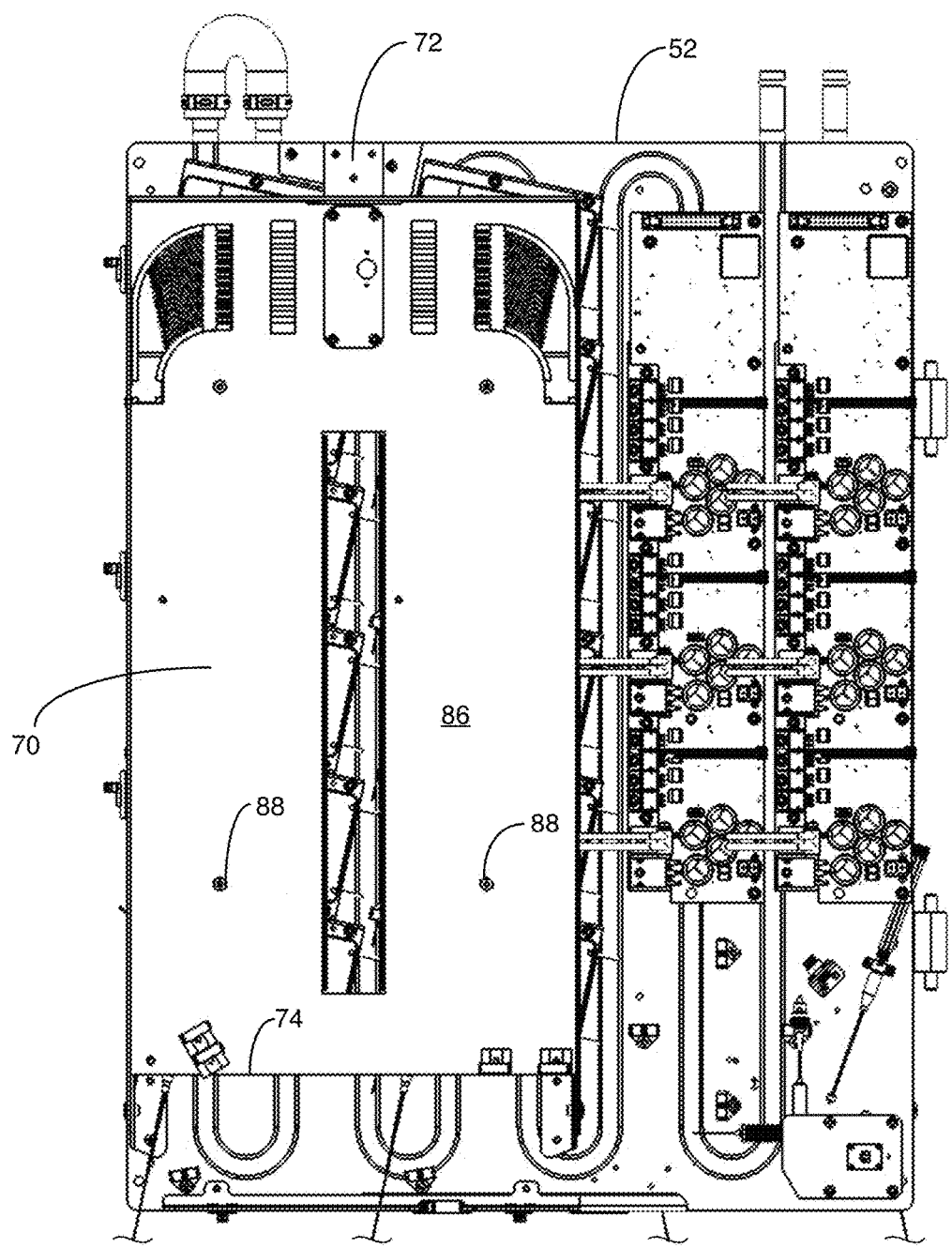
FIG. 9 is a top view of the fiber management tray of FIG. 8.
Figure 10:
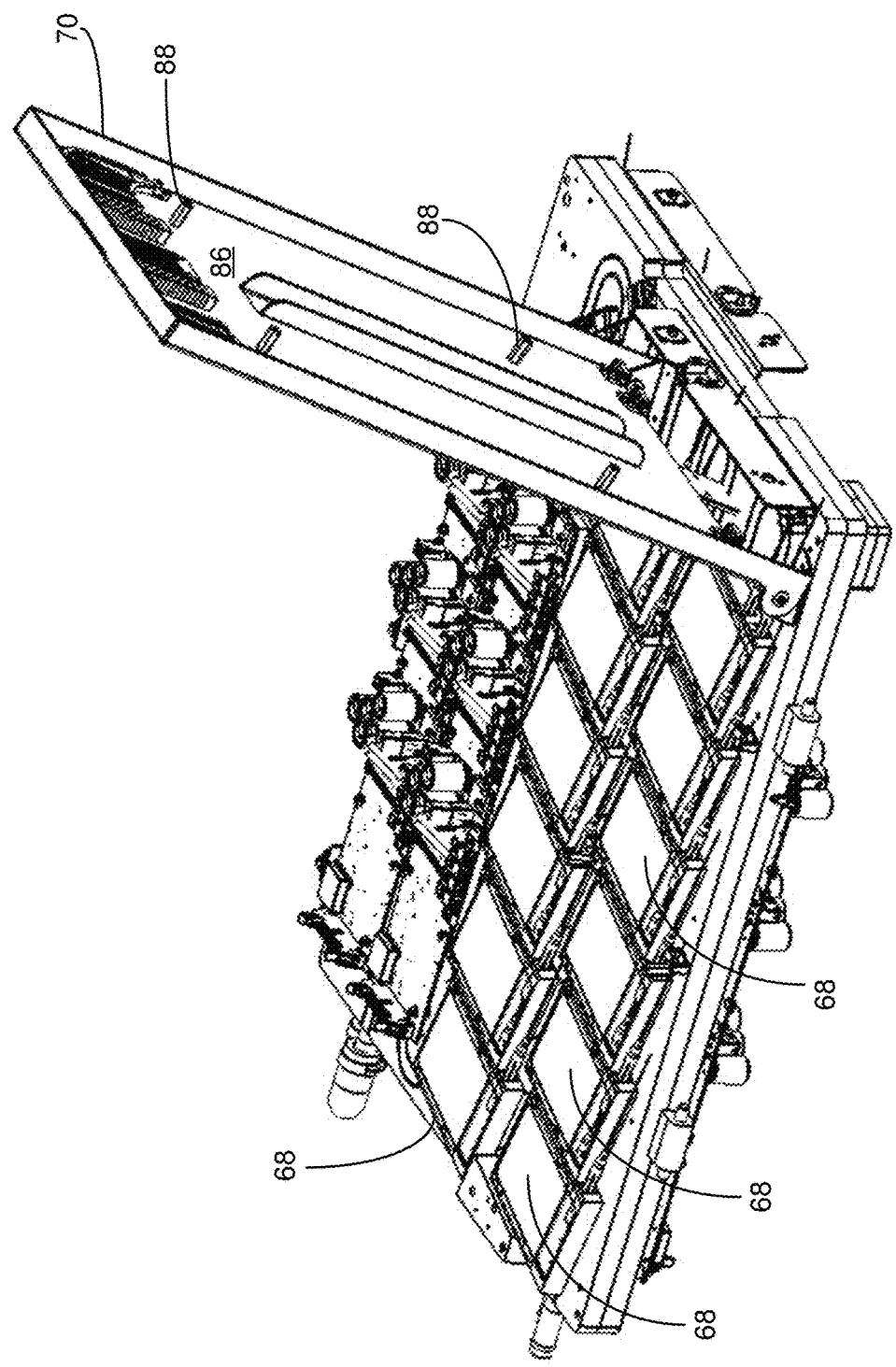
FIG. 10 is a perspective view of the fiber management tray of FIG. 8 in an open position.
Figure 11:
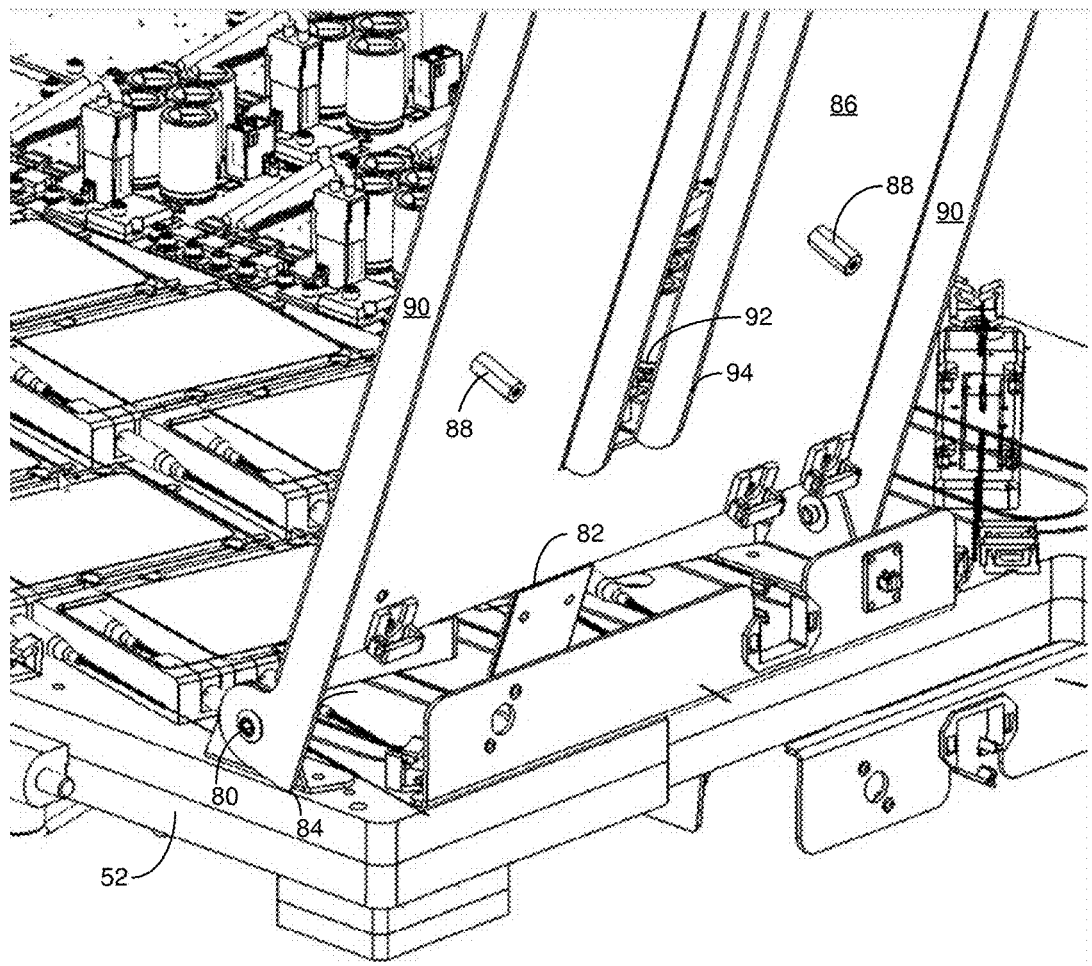
FIG. 11 is a partial view of the fiber management tray of FIG. 8.
Figure 14:
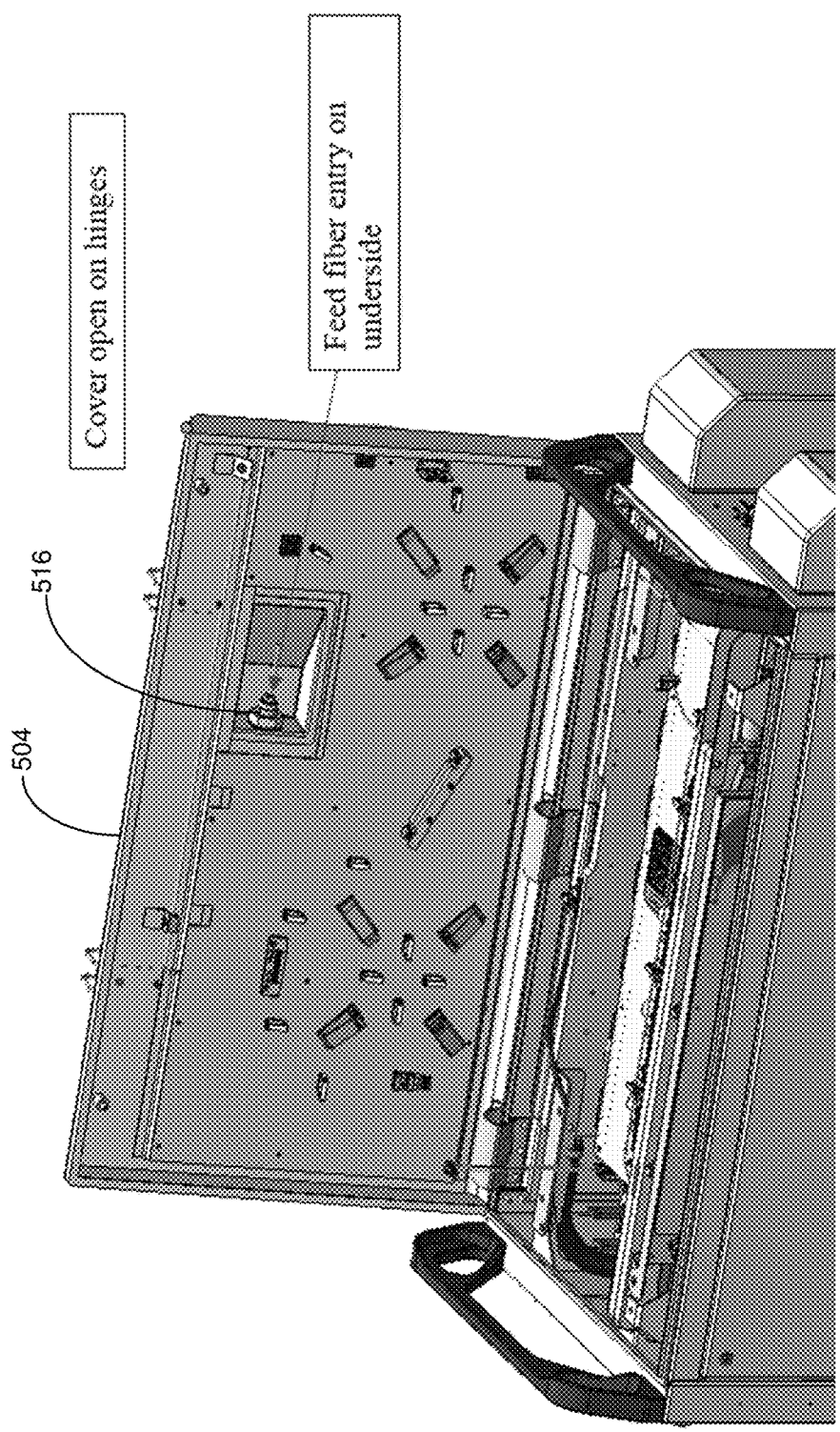
FIG. 14 is a top perspective partial view of the system of FIG. 12, showing the first outside wall in the open position.
Figure 15:
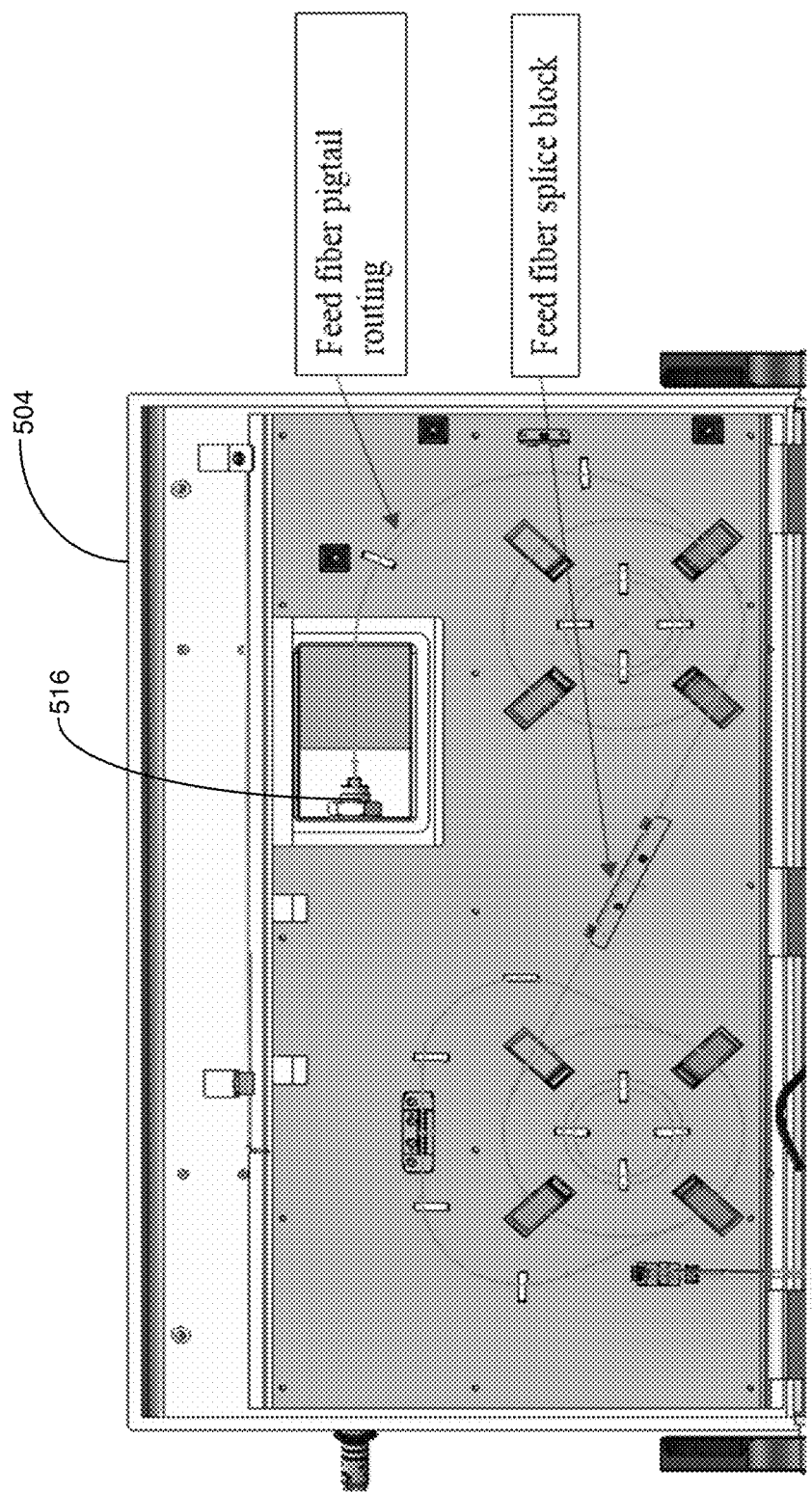
FIG. 15 is a side partial view of the system of FIG. 12, showing the first outside wall in the open position.
Figure 16:
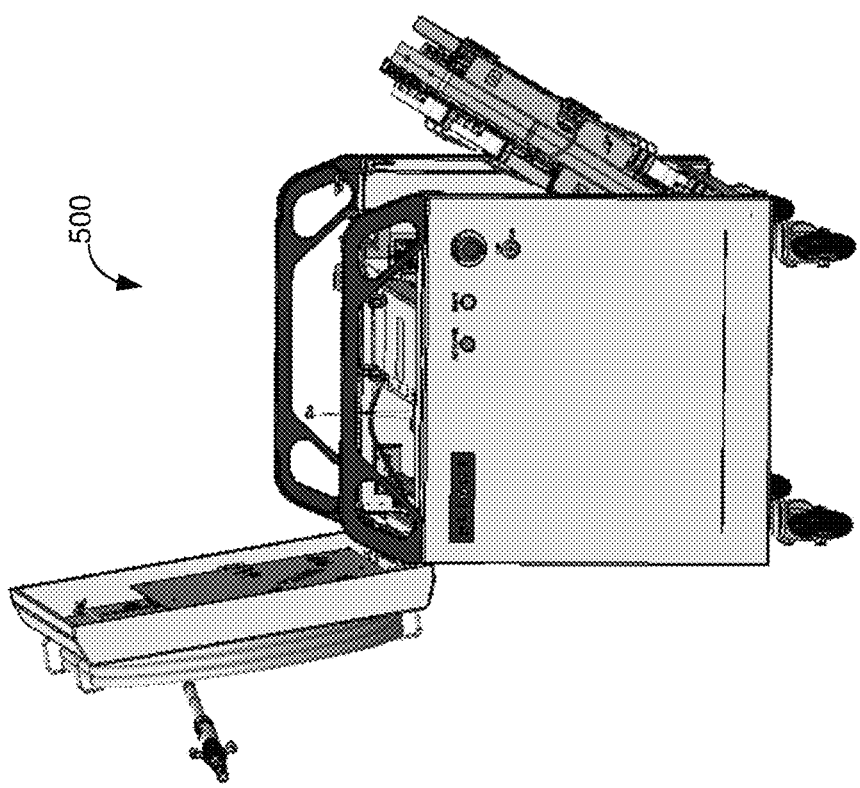
FIG. 16 is a side perspective view of the system of FIG. 12, showing the first outside wall in the open position and the second outside wall removed.
Figure 17:
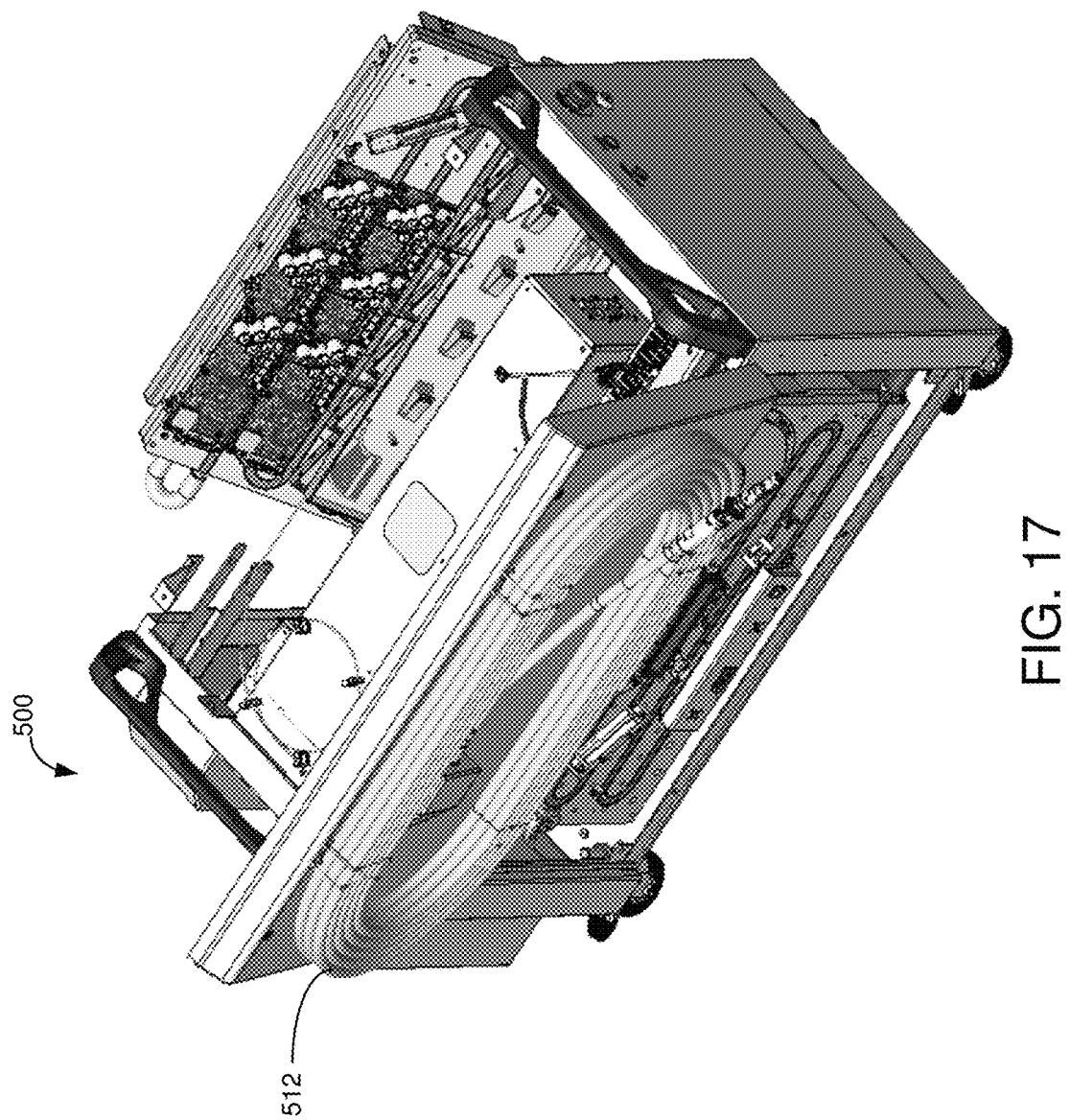
FIG. 17 is a top perspective view of the system of FIG. 12, showing the first outside wall in the open position and the second outside wall removed.
Figure 21:
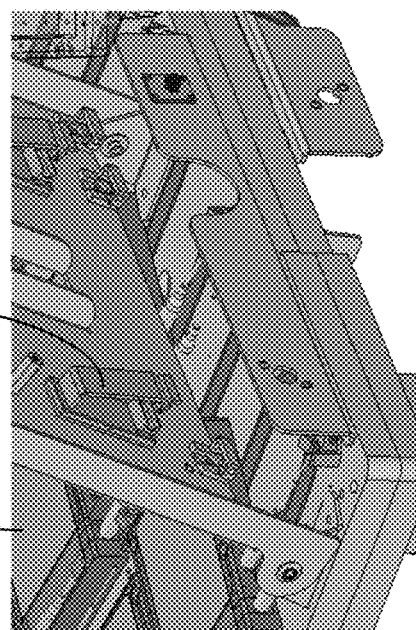
FIG. 21 is a partial view of the fiber management tray of FIG. 18.
Figure 20:
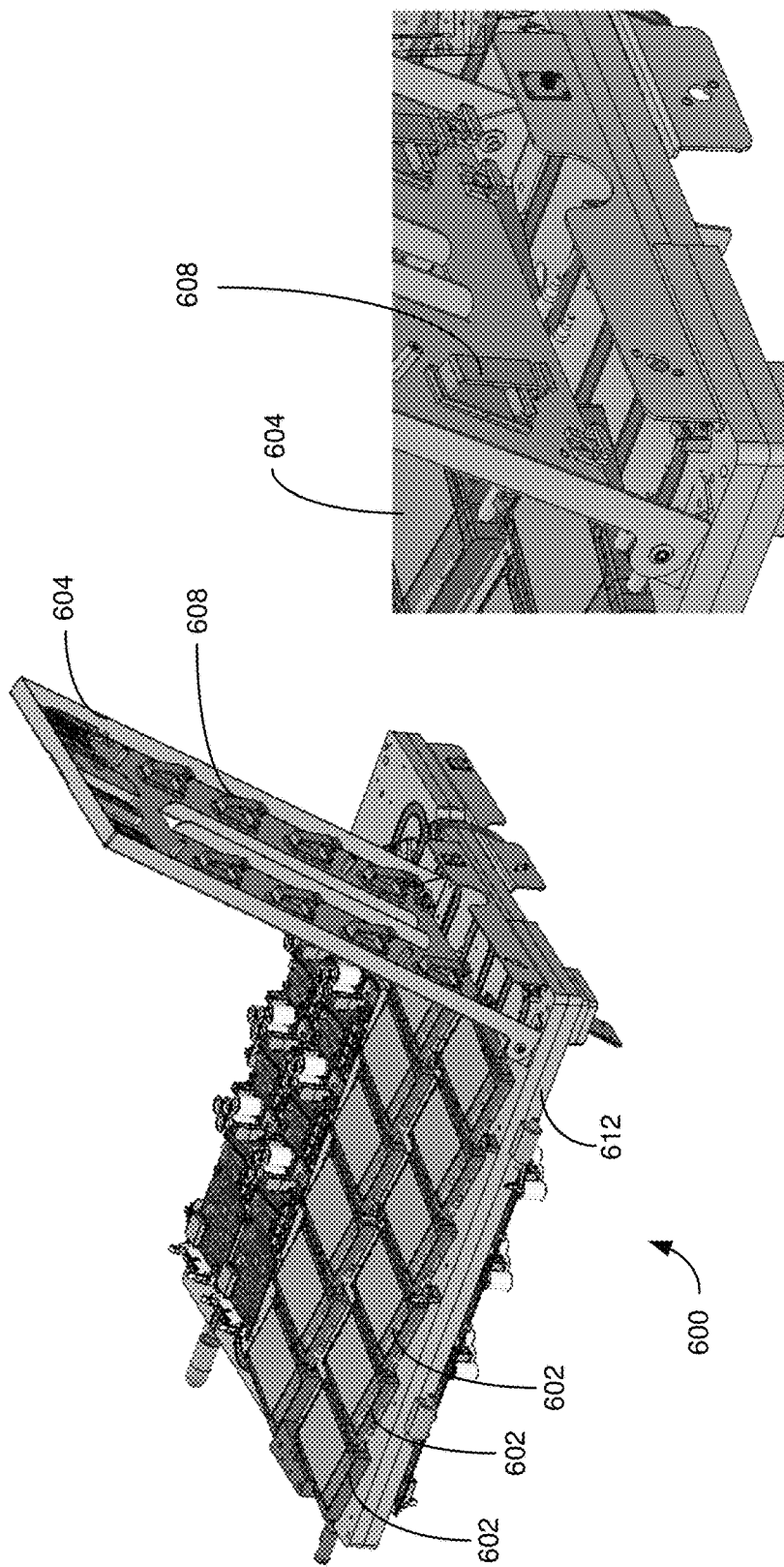
FIG. 20 is a perspective view of the fiber management tray of FIG. 18 in an open position.

In FIG. 3, a schematic is shown for an embodiment of a system 1010 similar to that shown in perspective view in FIGS. 1 and 2. The system 1010 includes a plurality of pump modules 1011 providing pump energy to a gain module 1012 which is configured to generate a laser system output 1013. The system 1010 can include one or more expansion slots 1014 to provide configuration changes to the system 1010, such as additional pump modules. A cooling system 1015 is coupled to the pump and gain modules to provide thermal stability therein and to the system 1010 as a whole. The system 1010 is controlled by a controller 1016 configured to monitor and adjust outputs and other properties of the pump modules, gain modules and cooling system.

Turning to FIGS. 1 and 4-7, in some embodiments the cover 14 can be hingedly attached to the main body 12 along a first side 22 by any attachment means known to those skilled in the art that allows the cover to hingedly move or to pivot with respect to the main body 12, for example one or more hinges 24. The cover 14 may have a closed position, shown in FIG. 1, and an open position, shown in FIGS. 4-7. A restraining member 26, such as an arm, may be mounted to the cover 14 and to the main body 12 to restrain the cover 14 from opening greater than a predetermined angle. Additionally and/or alternatively, the restraining arm may releasably lock the cover 14 into the open position. The system 10 may include a releasable lock 28 configured to releasably lock the cover 14 in the closed position. The releasable lock 28 may include one or more screws or other fastening means.

The cover 14 may be configured such that one or more system components can be removably mounted to a top surface 30 and/or an underside surface 32, also referred to as interior surface, of the cover 14. For example, a feed fiber may be removably mounted to the top surface 30 and/or underside surface 32 of the cover 14. Additionally and/or alternatively, the underside surface 32 of the cover 14 may be configured for feed fiber management and splicing. Feed fiber management and splicing components may be integrated on the cover 14, thereby reducing a number of components used to route and feed the feed fiber and providing a compact solution that efficiently uses the space within the system 10. The feed fiber can be accessed, maintained and/or replaced by releasing the releasable lock 28 and opening the hinged cover 14.

The cover 14 may include one or more integrated feed fiber management components, including but not limited to, feed fiber routing components and/or splicing components. The top surface 30 may include one or more feed fiber retaining brackets 34 configured to retain and guide the feed fiber on the top surface 30 and/or guide entry of the feed fiber into the interior of the main body 12. The retaining brackets 34 may guide the feed fiber to a feed fiber entry housing 36. The entry housing 36 may project from the top surface 30. Alternatively, the entry housing 36 may be recessed into the top surface 30. The entry housing 36 may be configured to pass a feed fiber from the top surface 30 to the underside surface 32 of the cover 14. For example, the entry housing 36 may include a face 38 extending perpendicular to the top surface 30 and defining a circular or other aperture 40. Alternatively, the aperture 40 may be parallel to the top surface 30 or at an angle to the top surface 30. The entry housing 36 and/or feed fiber may include a connector or adapter configured to fit the feed fiber onto or through the aperture 40.

The aperture 40 may extend through the cover 14, to the underside surface 32, thereby providing feed fiber entry to the underside of the cover 14 and/or the main body 12. The underside surface 32 may include components for management and/or splicing of feed fiber, including but not limited to a pigtail portion of the feed fiber. Feed fiber management components may include a first set of guide members 42, such as clips, channels, fasteners or any other means to guide feed fiber, configured to guide the pigtail portion of the feed fiber from the entry housing 36 to a splice block 44 mounted on the underside surface 32. In some embodiments, the splice block 44 may be removably mounted to the underside surface 32. Additionally and/or alternatively, the feed fiber management components may include a second set of guide members 46 configured to guide the feed fiber from the splice block 44 towards the hinged first side 22 of the cover 14. The first and/or second set of guide members 42, 46 may be mounted in a circular configuration on either side of the splice block 44. The feed fiber may be guided off of the cover 14 and towards another system module 18. In some embodiments, because the feed fiber is attached and managed on a single component of the system 10, specifically the hinged cover 14, the length of fiber required is less than necessary for other system configurations. Feed fiber associated problems and issues, such as the generation of stimulated Raman scattering (SRS), are reduced because of the reduced length of feed fiber necessary. Furthermore, the feed fiber and the feed fiber management and splicing components can be separate from and/or isolated from other system component fibers in the system 10, so collateral damage to other fibers, such as if a feed fiber splice block 44 burns, is reduced. In other words, one or more of the other fiber laser system components may include associated fibers and the feed fiber splice block may not be in direct contact with the associated fibers.

Additionally and/or alternatively, in some embodiments, one or more photodiodes 45 can be mounted and optically coupled to the interior of the main body, such as on the underside surface 32, an inward facing surface of the side panel 16, or support surfaces of the system modules 18, by way of example. The one or more photodiodes can sense light from the feed fiber(s), other optical fibers, or pump diodes, and can be coupled to the controller 1016 so as to evaluate feed fiber operation, and/or detect fiber or pump failure.

FIGS. 12-17 illustrate an alternative embodiment of a high-power fiber laser system 500 having a main body 502 and a cover 504 hingedly attached to the main body 502. System 500 illustrates exemplary placement of a feed fiber 512 with respect to the cover 504. The cover 504 can include a top surface 506 and an underside surface 508, also referred to as interior surface. System 500 can include one or more feed fiber retaining brackets 510 and/or a feed fiber entry housing 514 configured to retain and guide the feed fiber 512 on the top surface 506 and/or guide entry of the feed fiber 512 into the interior of the main body 502.

The entry housing 514 and/or cover 504 can define an aperture 516 the may extend through the cover 504, to the underside surface 508, thereby providing feed fiber 512 entry to the underside surface 508 of the cover 504 and/or the interior of the main body 502. The entry housing 36 and/or feed fiber 512 may include a connector 517 or adapter configured to fit the feed fiber 512 onto or through the aperture 40. The underside surface 508 may include components for management and/or splicing of feed fiber 512, including but not limited to a pigtail portion of the feed fiber. Feed fiber management components may include a first set of guide members 518, such as clips, channels, fasteners or any other means to guide feed fiber, configured to guide the pigtail portion of the feed fiber 512 from the entry housing 514 to a splice block 520 mounted on the underside surface 508. Additionally and/or alternatively, the feed fiber management components may include a second set of guide members 522 configured to guide the feed fiber 512 from the splice block 520.

As noted above, one or more of the outside walls may be removable and/or moveable with respect to the main body 12. As shown in FIGS. 2 and 4-7, the panel 16, also referred to as the second outside wall, can be removed from the main body 12. As shown in FIG. 1, the panel 16 may include one or more releasable fastening elements 48, such as screws, that can be loosened and removed to remove the panel 16. An upper case support beam 50 may also be removable.

Removal of the panel 16 and/or upper case support beam 50 can provide access to system components and/or system modules 18 in the main body 12. In some embodiments, a two-sided cooling plate 52 may be mounted adjacent to the panel 16 such that it is accessible when the panel 16 is removed. The cooling plate 52 may be a liquid cooling plate 52 having a first cooling side 54 and a second cooling side 56. Both of the first and second cooling sides 54, 56 of the cooling plate 52 may be utilized for cooling and mechanical support of system components.

In some embodiments, to allow compact packaging with components mounted to both sides of the liquid cooled plate, the cooling plate 52 may be mounted in a vertical orientation so neither of the first and second cooling sides 54, 56 are upside down. In the vertical orientation, the first cooling side 54 is immediately accessible for maintenance or parts replacement when the panel 16 is removed. Alternatively, the cooling plate 52 may be mounted adjacent an outside wall of the system 10 in a horizontal orientation. In some embodiments, the cooling plate 52 may be moveable with respect to the main body 12 to provide access to the second side 56. The cooling plate 52 may include an open position, wherein at least a portion of the cooling plate 52 is spaced from the main body 12, and a closed position, wherein the cooling plate 52 is flush with the main body 12. The cooling plate 52 can be hingedly attached to the main body 12 by any attachment means that allows the cooling plate 52 to hingedly move or to pivot with respect to the main body 12, for example the cooling plate 52 can include one or more hinges along a hinged edge 60 such that an opposing edge 62 can tilt away from the main body 12. The hinged edge 60 may include one or more of an upper, a lower or a side edge of the cooling plate 52. In the embodiment shown the hinged edge 60 is the lower edge. A restraining member 64 may extend between the main body 12 and the cooling plate 52 so that the cooling plate 52 is restrained from tilting beyond a predetermined angle. The cooling plate 52 may be releasably held in the closed position by two moveable brackets 66 mounted on the main body 12.

Turning to FIGS. 8-11, as noted earlier, both sides of the cooling plate 52 may be used to support and/or cool system components. For example, the first and/or the second side 54, 56 of the cooling plate 52 may support one or more pump diodes 68 and one or more fiber management trays 70 disposed over or adjacent to the one or more pump diodes 68. The fiber management tray 70 may support, guide and/or manage one or more pump diode fibers. Additionally and/or alternately, the one or more fiber management trays 70 may be disposed over or adjacent to any system component for support and management of system component fibers. The fiber management tray 70 may include a heat sink 72 extending from the fiber management tray 70 and in contact with a cooling element.

The fiber management trays 70 can be hingedly attached to the cooling plate 52 by any attachment means that allows the fiber management trays 70 to hingedly move or to pivot with respect to the cooling plate 52. In some embodiments, the fiber management trays 70 can include a hinged end 74 such that the fiber management tray 70 includes an open position, wherein access is provided to the system components underneath the fiber management tray 70, and a closed position, wherein the fiber management tray 70 is disposed over the system components. Accordingly, the fiber management tray 70 does not have to be removed from the system 10 in order to service the system components disposed underneath the fiber management tray 70. To access a system component disposed underneath the fiber management tray 70, the fiber management tray 70 is rotated to the open position. The fiber management tray 70 can be rotated back to the closed position whenever desired.

The fiber management tray 70 may include a body 76 and arms 78 that extend beyond the body 76. The distal ends of the arms 78 may be rotatably or hingedly attached via one or more hinges to the cooling plate 52 or other support surface on which system components are mounted. The arms 78 may extend beyond an edge 82 of the body 76 to ensure that fibers cannot be pinched between the support surface and the edge 82 of the body 76 when the fiber management tray 70 is in the open position. The arms 78 may include a stop end 84 to ensure that the fiber management tray 70 is prevented from more than a predetermined angle of rotation. The predetermined angle of rotation may be greater than 90 degrees with respect to the cooling plate 52 or support surface.

A top surface 86 of the fiber management tray 70 may include one or more clips, clasps or other guide elements 88 configured to guide and/or restrain fibers. The guide elements 88 may be configured to guide and/or restrain the fibers such that the fibers exit the fiber management tray 70 along the hinged side of the fiber management tray 70. Additionally and/or alternatively, the fiber management tray 70 may include walls 90 extending perpendicular (or other angle) the top surface 86 and/or a central slot 92 having walls 94 extending perpendicular (or other angle) to the top surface 86 to contain and/or guide the fibers.

FIGS. 18-21 illustrate an embodiment of a pump diode assembly 600 including a plurality of pump diodes 602 and a hinged fiber management tray 604 in accordance with the present disclosure. Similar to the embodiment disclosed above, the fiber management tray 604 may include an open position and a closed position. FIG. 19 illustrates an exemplary configuration of a plurality of fibers 606 and guide elements 608 on a top surface 610 of the fiber management tray 604. The plurality of pump diodes 602 and fiber management trays 604 may be mounted to either a first side or a second side of a cooling plate 612.

Examples are described with reference to directions indicated as "above," "below," "upper," "lower," "interior," "underside," and the like. These terms are used for convenient description, but do not imply any particular spatial orientation. In view of the many possible embodiments to which the principles of the disclosed technology may be applied, it should be recognized that the illustrated embodiments are only preferred examples of the disclosed technology and should not be taken as limiting the scope of the disclosed technology. Rather, the scope of the disclosed technology is defined by the following claims. We therefore claim as our disclosed technology all that comes within the scope and spirit of these claims.

We claim:

1. A fiber laser system, comprising:
a main body, wherein the main body includes one or more fiber laser system components;
a first wall hingedly attached to the main body along a first edge, the first wall having a first wall open position and a first wall closed position; and
a plurality of feed fiber management and splicing components mounted to the first wall;
wherein the plurality of feed fiber management and splicing components includes a feed fiber splice block removably mounted to an interior surface of the first wall;
wherein the plurality of feed fiber management and splicing components includes a first set of feed fiber guide members and a second set of feed fiber guide members mounted to the interior of the first wall on opposing sides of the feed fiber splice block;
wherein the first and second sets of feed fiber guide members are each mounted in a curved layout corresponding to a feed fiber path on opposing sides of the feed fiber splice block.

2. A fiber laser system, comprising:
a main body, wherein the main body includes one or more fiber laser system components;
a panel removably attached to the main body;
a cooling plate disposed adjacent to the panel and hingedly attached to the main body such that the cooling plate has a cooling plate open position and a cooling plate closed position, wherein the cooling plate open position is accessible with the panel removed;
one or more releasable retaining members configured to releasably retain the cooling plate in the cooling plate closed position; and
one or more fiber laser system components mounted to the first or the second side of the cooling plate;
wherein the cooling plate has a first side and a second side and the cooling plate is configured to provide cooling and support to one or more fiber laser system components on both the first and second sides;
wherein the one or more fiber laser system components comprise a plurality of pump diodes mounted to the cooling plate and a fiber management tray mounted to the cooling plate such that the plurality of pump diodes are disposed between the fiber management tray and the cooling plate.

3. A fiber laser system, comprising:
a main body, wherein the main body includes one or more fiber laser system components;
a panel removably attached to the main body; a cooling plate disposed adjacent to the panel;
a fiber management tray hingedly mounted to the cooling plate, the fiber management tray having an open position and a closed position;
a plurality of pump diodes mounted to the cooling plate, wherein in the fiber management tray open position the plurality of pump diodes are accessible and in the fiber management tray closed position the plurality of pump diodes are inaccessible; and
one or more photodiodes optically coupled to an interior volume of the main body and situated to sense light associated with laser operation or fiber failure;
wherein the cooling plate has a first side and a second side and the cooling plate is configured to provide cooling and support to one or more fiber laser system components on both the first and second sides.

4. A fiber laser system, comprising:
a main body, wherein the main body includes one or more fiber laser system components;
a first wall hingedly attached to the main body along a first edge, the first wall having a first wall open position and a first wall closed position;
a plurality of feed fiber management and splicing components mounted to the first wall;
a cooling plate hingedly attached to the main body, the cooling plate has a cooling plate open position and a cooling plate closed position; and
a fiber management tray hingedly mounted to the cooling plate, the fiber management tray having a fiber management tray open position and a fiber management tray closed position.

5. The laser system of claim 4, wherein the plurality of feed fiber management and splicing components includes a feed fiber splice block removably mounted to an interior surface of the first wall.

6. The laser system of claim 5, wherein the plurality of feed fiber management and splicing components includes a first set of feed fiber guide members and a second set of feed fiber guide members mounted to the interior of the first wall on opposing sides of the feed fiber splice block.

7. The laser system of claim 6, wherein the first and second sets of feed fiber guide members are each mounted in a curved layout corresponding to a feed fiber path on opposing sides of the feed fiber splice block.

8. The laser system of claim 5, wherein the one or more fiber laser system components include one or more system component fibers and the feed fiber splice block is not in direct contact with the one or more system component fibers.

9. The laser system of claim 4, wherein the first wall defines an aperture configured to guide a feed fiber from a top surface of the first wall to an interior surface of the first wall.

10. The laser system of claim 4, further comprising a feed fiber entry housing mounted to the first wall and having a face that is situated at a non-zero angle to a top surface of the first wall, wherein an entry housing face defines an aperture configured to guide a feed fiber from the top surface of the first wall to an interior surface of the first wall.

11. The laser system of claim 4, further comprising a restraining arm configured to restrain the first wall from hingedly moving beyond a predetermined angle.

12. The laser system of claim 4, further comprising one or more photodiodes optically coupled to an interior volume of the main body and situated to sense pump or laser light associated with laser operation or fiber failure.

13. The laser system of claim 4, wherein the cooling plate has a first side and a second side and the cooling plate is configured to provide cooling and support to one or more fiber laser system components on both the first and second sides.

14. The laser system of claim 13, wherein in the cooling plate open position the second side is accessible and in the cooling plate closed position the second side is inaccessible.

15. The laser system of claim 13, further comprising one or more fiber laser system components mounted to the first or the second side of the cooling plate.

16. The laser system of claim 15, wherein the one or more fiber laser system components comprise a plurality of pump diodes mounted to the cooling plate and a fiber management tray mounted to the cooling plate such that the plurality of pump diodes are disposed between the fiber management tray and the cooling plate.

17. The laser system of claim 16, wherein in the fiber management tray open position the plurality of pump diodes are accessible and in the fiber management tray closed position the plurality of pump diodes are inaccessible.

18. The laser system of claim 17, wherein the fiber management tray includes a body and two arms extending from the body, the two arms hingedly attached to the cooling plate, such that in the fiber management tray open position the body is spaced from the cooling plate.

19. The laser system of claim 16, wherein the fiber management tray includes a heat sink.

20. The laser system of claim 16, wherein a top surface of the fiber management tray includes a plurality of guide elements configured to guide or retain pump diode fibers.

21. The laser system of claim 20, wherein the fiber management tray includes a centrally disposed slot having walls that extend at an angle to the top surface.

22. The laser system of claim 20, wherein the fiber management tray perimeter includes one or more walls that extend perpendicular to the top surface.

23. The laser system of claim 4, further comprising a restraining arm configured to restrain the cooling plate from hingedly moving beyond a predetermined angle.

24. The laser system of claim 4, further comprising one or more releasable retaining members configured to releasably retain the cooling plate in the cooling plate closed position.

25. The laser system of claim 4, further comprising one or more photodiodes optically coupled to an interior volume of the main body and situated to sense light associated with laser operation or fiber failure.

26. The laser system of claim 4, further comprising a plurality of pump diodes mounted to the cooling plate, wherein in the fiber management tray open position the plurality of pump diodes are accessible and in the fiber management tray closed position the plurality of pump diodes are inaccessible.

27. The laser system of claim 26, wherein a top surface of the fiber management tray includes a plurality of guide elements configured to guide or retain pump diode fibers.

28. The laser system of claim 27, wherein the fiber management tray includes a centrally disposed slot having walls that extend at one or more angles to the top surface.

29. The laser system of claim 27, wherein the fiber management tray perimeter includes walls that extend perpendicularly to the top surface.

30. The laser system of claim 26, wherein the cooling plate has a first side and a second side and the cooling plate is configured to provide cooling and support to one or more fiber laser system components on both the first and second sides.

31. The laser system of claim 30, wherein wherein when the panel is removed from the main body, the cooling plate has the open position and the closed position.

32. The laser system of claim 31, wherein in the cooling plate open position the second side is accessible and in the cooling plate closed position the second side is inaccessible.

33. The laser system of claim 30, further comprising a restraining arm configured to restrain the cooling plate from hingedly moving beyond a predetermined angle.

34. The laser system of claim 30, further comprising one or more releasable retaining members configured to releasably retain the cooling plate in the cooling plate closed position.

35. The laser system of claim 30, further comprising one or more fiber laser system components mounted to the first and the second side of the cooling plate.

36. The laser system of claim 4, wherein the fiber management tray includes a body and two arms extending from the body, the two arms hingedly attached to the cooling plate, such that in the fiber management tray open position the body is spaced from the cooling plate.

37. The laser system of claim 4, wherein the fiber management tray includes a heat sink.

38. The laser system of claim 4, further comprising one or more photodiodes optically coupled to an interior volume of the main body and situated to sense light associated with laser operation or fiber failure.

\* \* \* \* \*